(12) United States Patent
Iwakura et al.

(10) Patent No.: US 11,016,509 B2
(45) Date of Patent: May 25, 2021

(54) IMAGE CAPTURING SYSTEM FOR SHAPE MEASUREMENT OF STRUCTURE, ON-BOARD CONTROLLER

(71) Applicant: Mitsubishi Electric Corporation, Chiyoda-ku (JP)

(72) Inventors: Takashi Iwakura, Chiyoda-ku (JP); Takayuki Ishida, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 108 days.

(21) Appl. No.: 16/361,569

(22) Filed: Mar. 22, 2019

(65) Prior Publication Data

US 2019/0302806 A1   Oct. 3, 2019

(30) Foreign Application Priority Data

Mar. 30, 2018   (JP) .............................. JP2018-067138

(51) Int. Cl.
| | |
|---|---|
| *G01C 23/00* | (2006.01) |
| *G05D 1/00* | (2006.01) |
| *G05D 3/00* | (2006.01) |
| *G06F 7/00* | (2006.01) |
| *G06F 17/00* | (2019.01) |
| *G05D 1/10* | (2006.01) |
| *G06T 7/521* | (2017.01) |
| *B60R 11/04* | (2006.01) |
| *G06F 30/00* | (2020.01) |

(52) U.S. Cl.
CPC .............. *G05D 1/101* (2013.01); *B60R 11/04* (2013.01); *G06F 30/00* (2020.01); *G06T 7/521* (2017.01)

(58) Field of Classification Search
CPC ........ G05D 1/101; G05D 1/00; G05D 1/0011; G06T 7/521; B60R 11/04; G01C 23/00; G06F 30/00
USPC ......................................................... 701/3, 2
See application file for complete search history.

(56) References Cited

U.S. PATENT DOCUMENTS

| | | | |
|---|---|---|---|
| 2014/0371952 A1 | 12/2014 | Ohtomo et al. | |
| 2016/0349746 A1* | 12/2016 | Grau .................... | G05D 1/0094 |
| 2018/0023974 A1* | 1/2018 | Otani ................... | G01C 21/005 |
| | | | 701/3 |

FOREIGN PATENT DOCUMENTS

| | | |
|---|---|---|
| JP | 2006-51864 | 2/2006 |
| JP | 5882951 | 3/2016 |

* cited by examiner

*Primary Examiner* — Mahmoud S Ismail
(74) *Attorney, Agent, or Firm* — Oblon, McClelland, Maier & Neustadt, L.L.P.

(57) ABSTRACT

A laser tracker is installed on the ground, and an active target is mounted on an air vehicle. A reference coordinate system is set for the laser tracker, and a flight scenario created in advance based on a 3D model is used. Flight of the air vehicle is performed while an amount of deviation from the flight scenario is being calculated using position information obtained by the laser tracker, and corrections are being made. The air vehicle is instructed not only on an amount of movement but also on speed, so that efficient flight can be performed in consideration of battery capacity.

7 Claims, 14 Drawing Sheets

IMAGE CAPTURING SYSTEM FOR SHAPE MEASUREMENT OF STRUCTURE, ON-BOARD CONTROLLER

CROSS REFERENCE TO RELATED APPLICATIONS

The present application is based upon and claims the benefit of priority to Japanese Patent Application No. 2018-067138 filed on Mar. 30, 2018, the entire contents of which are incorporated herein by reference.

BACKGROUND OF THE INVENTION

Field of the Invention

The present invention relates to a system for capturing an image of a structure for shape measurement of the structure using an image capturing device mounted on an air vehicle.

Description of the Background Art

In recent years, there have been proposed various systems for measuring geographical features or the like using image capturing devices mounted on mainly remotely controlled air vehicles, such as a drone, a multicopter, and an UAV (Unmanned Air Vehicle). On the other hand, in a photographic measurement system, an air vehicle used therein is controlled by human being or is guidance-controlled based on GPS (Global Positioning System). Geographical feature and aerial photographic measurements are performed in the following manner: the air vehicle is guided to image capturing points and captures images at the plurality of image capturing points, and then all the captured images are combined. Other than the GPS-based guidance control, there have also been proposed some flight control methods without using GPS (Japanese Patent No. 5882951 and Japanese Patent Laying-Open No 2006-51864, for example).

Studies have also been conducted on measuring the shape of a large-sized structure using the air vehicles as described above. For a large-sized structure, precision in shape has been measured using photogrammetry. The photogrammetry is a photographic measurement in which size and shape of a three-dimensional object are determined by analyzing parallax information from captured two-dimensional images of the three-dimensional object at a plurality of observation points. In recent years, the photogrammetry has been used for a three-dimensional shape measurement device employing a digital camera.

Conventionally, position control using GPS has been mainly performed for flight of the air vehicles as described above. However, it has been difficult for the air vehicles to fly autonomously in a non-GPS environment such as a closed space where a GPS signal cannot be received. In the case of a large-sized structure such as a high-precision parabolic antenna, the large-sized structure needs to be assembled indoors once during production in order to verify precision, and GPS may be unable to be used during image capturing. Moreover, images of the large-sized structure need to be captured also in a final installation state; however, the large-sized structure may be installed in a location that is not in the GPS environment. Therefore, it is desirable to fly and capture images even not in the GPS environment. There is also a problem of fluctuation in a GPS signal even during flight in the GPS environment, resulting in degradation in positional precision.

Japanese Patent No. 5882951 describes a flight control method using a measurement instrument capable of performing tracking. However, a method of creating a flight plan (flight scenario) is not clearly specified, and a method for flight control based on measurement is not explicitly described, either. In addition, information acquired by the measurement instrument needs to be transformed to GPS coordinates, resulting in poor real-time performance. It is also assumed that a method of simply reflecting a light wave from a position measurement instrument such as a total station has difficulty in position measurement depending on the flight angle and flight position.

Japanese Patent Laying-Open No. 2006-51864 describes a method of calculating position and posture by installing cameras on the ground and capturing images of a marker attached to an air vehicle. In this case, a plurality of cameras need to be installed within a flight range. In addition, the cameras may not be able to capture images of the marker successfully if there are obstacles on a flight path.

SUMMARY OF THE INVENTION

An object of the present invention is to provide an image capturing system for shape measurement of a structure, which is capable of efficiently capturing an image for shape measurement of a structure even in an environment where GPS cannot be used, and an on-board controller.

The present disclosure relates to an image capturing system for shape measurement of a structure. The image capturing system includes: an air vehicle configured to fly and hover; a ground measurement instrument configured to measure a position of the air vehicle; an image capturing device mounted on the air vehicle and configured to capture an image of the structure; an on-board controller mounted on the air vehicle; and a remote controller. The remote controller includes a scenario creator configured to create a flight scenario including an image capturing point and an image capturing condition when capturing the image, and a scenario transferer configured to transfer the flight scenario created by the scenario creator to the on-board controller. The on-board controller includes a flight scenario storage configured to store the flight scenario, an image capturing controller configured to control the image capturing device, and a flight controller configured to control the air vehicle based on the flight scenario. The flight controller is configured to correct the position of the air vehicle based on an instruction from a flight position corrector, the flight position corrector being configured to calculate, based on a result of measurement by the ground measurement instrument, an amount of deviation in the position of the air vehicle from a position indicated by the flight scenario.

An on-board controller according to another aspect of the present disclosure is an on-board controller mounted on an air vehicle, the air vehicle having mounted thereon an image capturing device configured to capture an image of a structure, and being configured to fly and hover. The on-board controller includes: a flight scenario storage configured to store a flight scenario including an image capturing point and an image capturing condition when capturing the image; an image capturing controller configured to control the image capturing device; and a flight controller configured to control the air vehicle based on the flight scenario. The flight controller is configured to correct a position of the air vehicle based on an amount of deviation in the position of the air vehicle from the flight scenario, the amount of deviation being calculated based on a result of measurement by a ground measurement instrument configured to measure the position of the air vehicle.

According to the present invention, the shape measurement of the structure can be performed efficiently in a short period of time in accordance with the predetermined flight scenario. Moreover, the flight of the air vehicle and the measurement of the structure can be performed even in an environment where GPS cannot be used.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
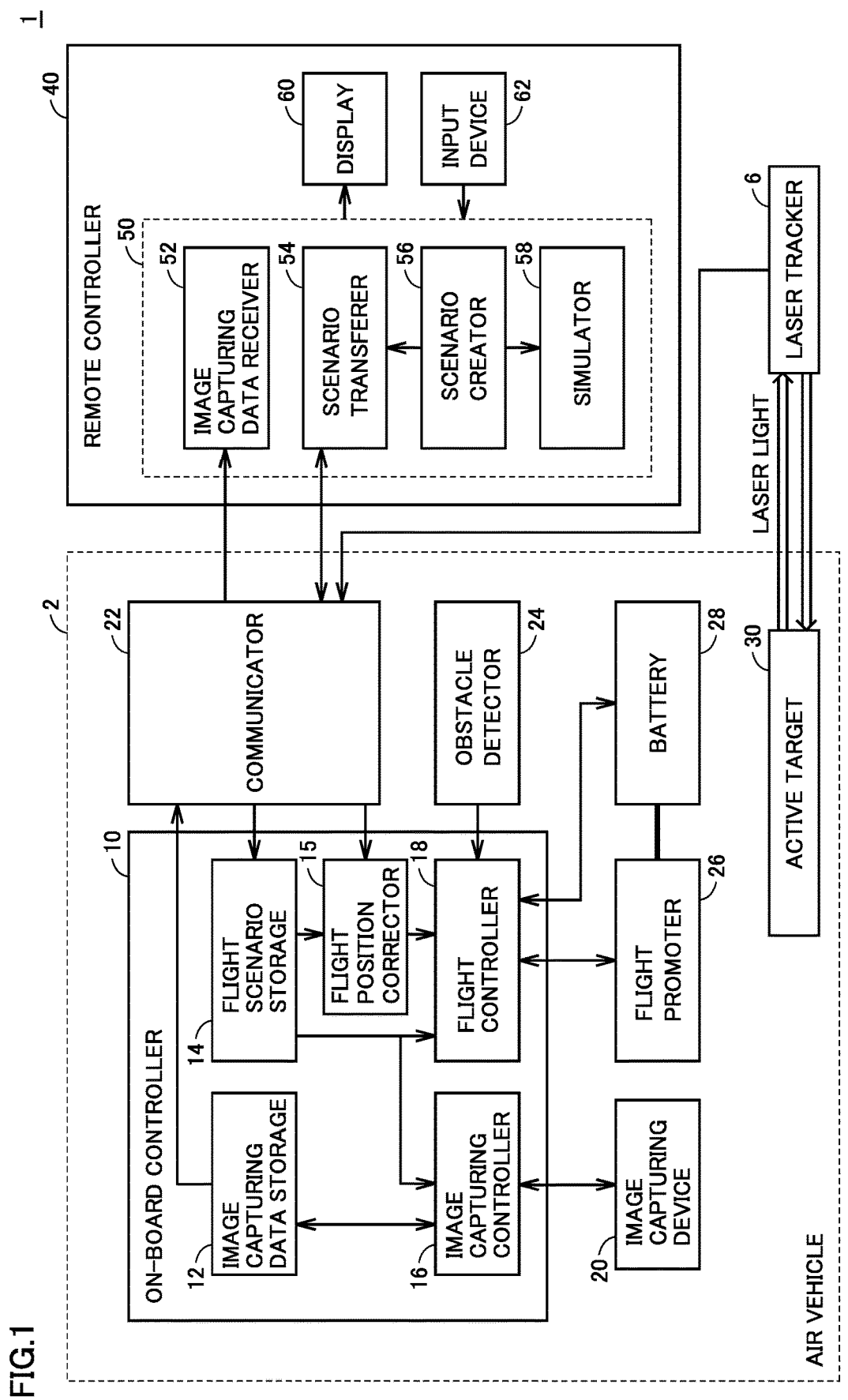
FIG. 1 is a block diagram showing a configuration of an image capturing system for shape measurement of a structure according to a first embodiment.

In the following, embodiments of the present invention will be described in detail with reference to the drawings. While a plurality of embodiments are described below, it has been intended from the time of filing of the present application to appropriately combine configurations described in the respective embodiments. The same or corresponding parts are designated by the same characters in the drawings and will not be described repeatedly.

First Embodiment

FIG. 1 is a block diagram showing a configuration of an image capturing system for shape measurement of a structure according to a first embodiment. An image capturing system 1 for shape measurement of a structure includes: an image capturing device 20 configured to capture an image of the structure; an air vehicle 2; an on-board controller 10 mounted on air vehicle 2; a remote controller 40 configured to transfer data to on-board controller 10; and a laser tracker 6 serving as a ground measurement instrument configured to measure a position of the air vehicle. Air vehicle 2 is a pilotless airplane having image capturing device 20 mounted thereon. Air vehicle 2 is configured to fly and hover. Examples of air vehicle 2 usable herein include a drone, a multicopter, and an UAV. Image capturing system 1 for shape measurement further includes a communicator 22, an obstacle detector 24, a flight promoter 26, a battery 28, and an active target 30, which are mounted on air vehicle 2.

Figure 16:
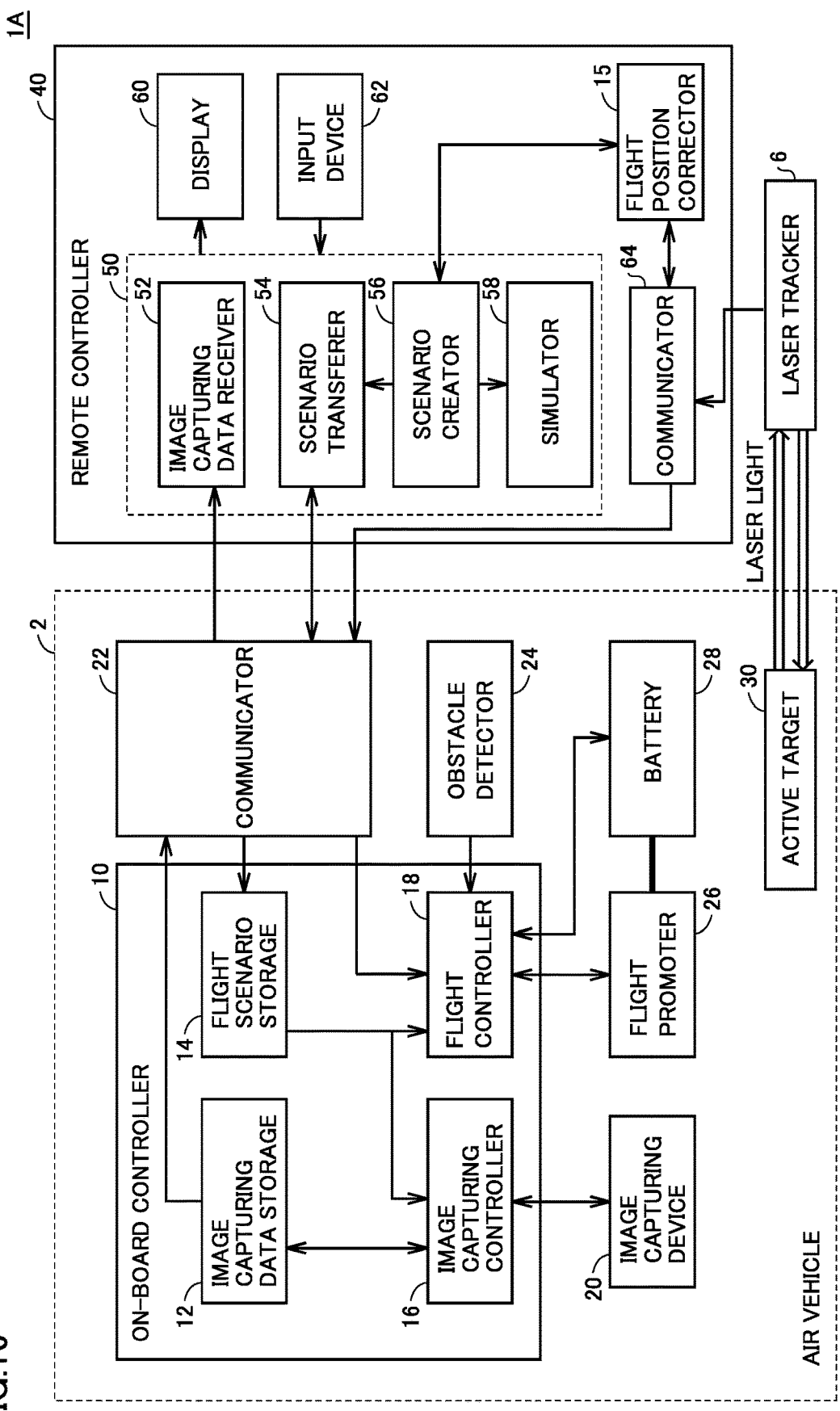
FIG. 16 is a block diagram showing a configuration of a modification of the image capturing system for shape measurement of a structure.

On-board controller 10 includes a flight scenario storage 14, a flight position corrector 15, an image capturing controller 16, and a flight controller 18. Flight scenario storage 14 is configured to store a flight scenario. Image capturing controller 16 is configured to control image capturing device 20 in accordance with the flight scenario. Flight controller 18 is configured to control air vehicle 2 in accordance with the flight scenario. Flight position corrector 15 is configured to calculate, based on a result of measurement by laser tracker 6, an amount of positional deviation of air vehicle 2 from a position indicated by the flight scenario, and instruct flight controller 18 on an amount of positional correction of air vehicle 2. Preferably, flight position corrector 15 is configured to, after flight controller 18 has moved air vehicle 2 to an image capturing point, calculate an amount of deviation between coordinates of the image capturing point and coordinates of the position of air vehicle 2, and instruct flight controller 18 to make a correction. It should be noted that the calculation of the amount of positional deviation of air vehicle 2 and the instruction by flight position corrector 15 may be performed on remote controller 40, as in an image capturing system 1A shown in FIG. 16. Flight position corrector 15 may be configured to receive a result of measurement by laser tracker 6 through a communicator 64 provided in remote controller 40, calculate an amount of positional deviation of air vehicle 2, and transmit to air vehicle 2 an instruction to correct the amount of positional deviation, and flight controller 18 may be configured to correct the position of air vehicle 2 based on this instruction.

Turning back to FIG. 1, remote controller 40 is a remote controller configured to remotely control air vehicle 2. Remote controller 40 includes a main processor 50, a display 60, and an input device 62. Main processor 50 includes a scenario creator 56, a simulator 58, a scenario transferer 54, and an image capturing data receiver 52.

Scenario creator 56 is configured to create a flight scenario based on an input from an operator. Scenario creator 56 is configured to: present, to the operator, shape information that is based on three-dimensional CAD (Computer-Aided design) information of the target structure; determine a plurality of image capturing points based on the input from the operator; and determine a flight route from a flight start point to a flight end point via a plurality of image capturing points. It should be noted that each of the image capturing points is a point at which the air vehicle is located when capturing an image of the structure.

In the shape measurement using the photogrammetry, a distance from the target during the image capturing affects precision of measurement. Hence, during the image capturing, the distance between the air vehicle and the target structure needs to be maintained to be a certain distance (referred to as "image capturing distance" hereinafter) determined based on precision required for the shape measurement.

Based on the input from the operator, scenario creator 56 is configured to determine a plurality of image capturing points spaced from the structure by the image capturing distance. Scenario creator 56 is configured to create the flight scenario based on the determined image capturing points. Moreover, the operator inputs image capturing conditions for each of the image capturing points.

The image capturing conditions include: the number of images to be captured at the image capturing point; an image capturing direction in each image capturing; an image capturing range; image capturing pixels; an aperture; a shutter speed; and the like. The flight scenario includes the image capturing points, the image capturing conditions, and the flight route including the image capturing points. The flight start point may be the same as or different from the flight end point.

Remote controller 40 is configured to create a flight scenario including the image capturing points based on the shape information of the structure. Scenario creator 56 is configured to create a flight route in which air vehicle 2 does not meet the structure. Scenario creator 56 is configured to check whether or not a path connecting a first image capturing point to a second image capturing point in a straight line meets the structure, the first image capturing point and the second image capturing point being different image capturing points. When the path does not meet the structure, scenario creator 56 is configured to create a flight route including the path connecting the first image capturing point to the second image capturing point in a straight line. When the path connecting the first image capturing point to the second image capturing point in a straight line meets the structure, on the other hand, scenario creator 56 is configured to create a flight route including a path avoiding the structure between the first image capturing point and the second image capturing point.

Simulator 58 is configured to check the flight scenario created by scenario creator 56 by performing a simulation of the flight scenario before performing the flight scenario in the air vehicle. Simulator 58 is configured to present, to the operator, presence/absence of an obstacle on the flight route, a flight time estimate value, and a battery remaining amount estimate value after the flight of the air vehicle on the flight route. It should be noted that simulator 58 may be configured to present, to the operator, at least one of the presence/absence of the obstacle on the flight route, the flight time estimate value, and the battery remaining amount estimate value after the flight of the air vehicle on the flight route.

Scenario transferer 54 is configured to transfer the flight scenario created by scenario creator 56 to on-board controller 10, and store the flight scenario in flight scenario storage 14.

Flight controller 18 is configured to control air vehicle 2 to achieve a determined image capturing distance between air vehicle 2 and the structure at the image capturing point. Flight controller 18 is configured to control air vehicle 2 in accordance with the flight scenario including the image capturing point spaced from the structure by the determined image capturing distance, the flight scenario being created based on the shape information of the structure. It should be noted that air vehicle 2 may further include a distance measurer mounted on air vehicle 2 and configured to measure a distance between air vehicle 2 and the structure. In this case, based on a result of the measurement by the distance measurer, flight controller 18 is configured to control air vehicle 2 to achieve the determined image capturing distance between air vehicle 2 at the image capturing point and the structure. Obstacle detector 24 is mounted on air vehicle 2 and is configured to detect an obstacle around air vehicle 2. When obstacle detector 24 detects an obstacle on the flight route included in the flight scenario during the flight, flight controller 18 is configured to change the flight route to avoid the obstacle to reach the image capturing point.

Figure 2:
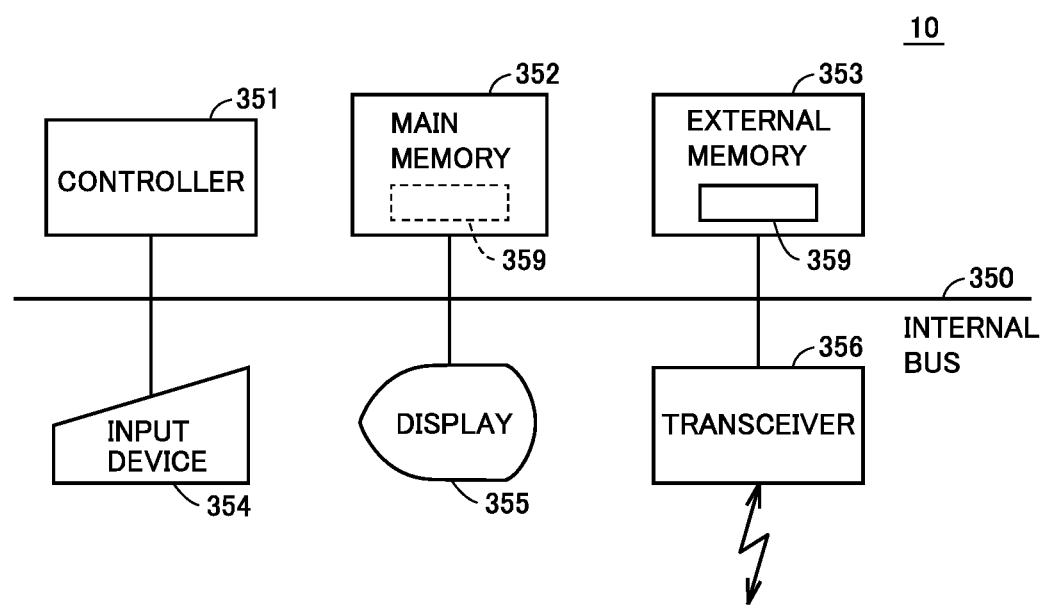
FIG. 2 is a block diagram showing an exemplary hardware configuration of an on-board controller 10.

FIG. 2 is a block diagram showing an exemplary hardware configuration of on-board controller 10. On-board controller 10 includes a controller 351, a main memory 352, an external memory 353, an input device 354, a display 355, and a transceiver 356. Each of main memory 352, external memory 353, input device 354, display 355, and transceiver 356 is connected to controller 351 via an internal bus 350.

Controller 351 is constituted of a CPU or the like, and performs a flight process, an image capturing process and the like in accordance with a control program 359 stored in external memory 353.

Main memory 352 is constituted of a RAM or the like, control program 359 stored in external memory 353 is loaded thereto, and main memory 352 is used as a workspace of controller 351.

External memory 353 is constituted of a nonvolatile memory such as a flash memory or a hard disk. External memory 353 beforehand stores a program for causing controller 351 to perform a process of on-board controller 10. Moreover, in accordance with an instruction from controller 351, this program supplies stored data to controller 351, and stores data supplied from controller 351. Image capturing data storage 12 and flight scenario storage 14 of on-board controller 10 are implemented in external memory 353.

Input device 354 is constituted of an interface device that connects an operation button or the like to internal bus 350. When the user inputs a command such as forced termination or rebooting to the on-board controller, information entered via input device 354 is supplied to controller 351.

Display 355 is constituted of an LED, an LCD, or the like. When the user inputs a command such as forced termination or rebooting to on-board controller 10, display 355 presents the state of on-board controller 10.

Controller 351 and transceiver 356 function as flight position corrector 15, image capturing controller 16 and flight controller 18 when the program stored in external memory 353 is executed by controller 351.

Figure 3:
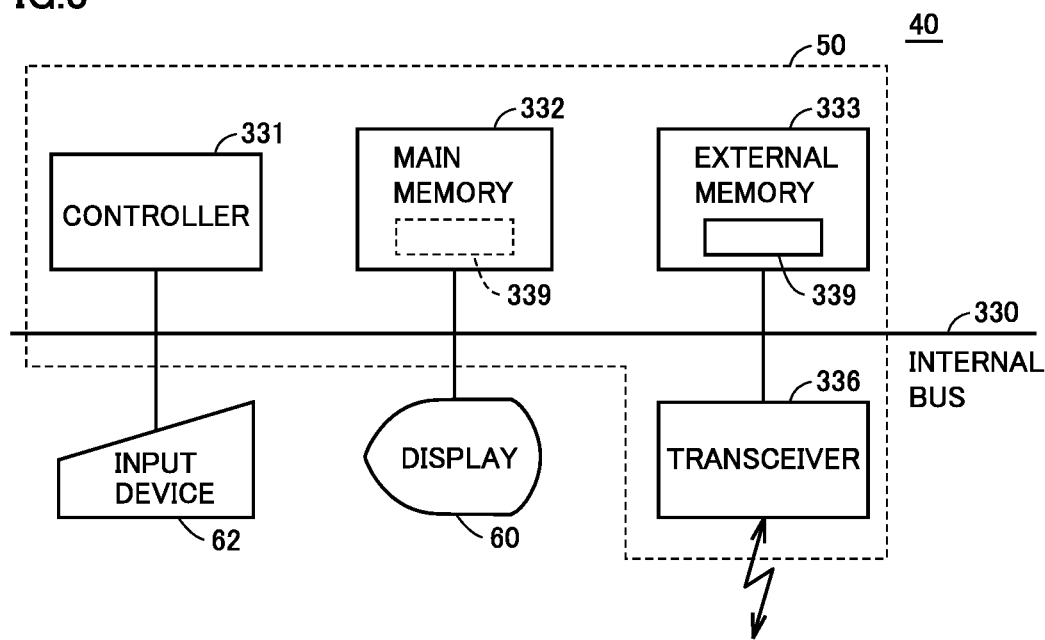
FIG. 3 is a block diagram showing an exemplary hardware configuration of a remote controller 40.

FIG. 3 is a block diagram showing an exemplary hardware configuration of remote controller 40. Remote controller 40 includes main processor 50, display 60, and input device 62. Main processor 50 includes a controller 331, a main memory 332, an external memory 333, and a transceiver 336. Each of main memory 332, external memory 333, input device 62, display 60, and transceiver 336 is connected to controller 331 via an internal bus 330.

Controller 331 is constituted of a CPU (Central Processing Unit) or the like, and performs processes of creating the flight scenario, transferring the flight scenario and the like in accordance with a control program 339 stored in external memory 333.

Main memory 332 is constituted of a RAM (Random-Access Memory) or the like, control program 339 stored in external memory 333 is loaded thereto, and main memory 332 is used as a workspace of controller 331.

External memory 333 is constituted of a nonvolatile memory such as a flash memory, a hard disk, a DVD-RAM (Digital Versatile Disc Random-Access Memory), or a DVD-RW (Digital Versatile Disc ReWritable). External memory 333 beforehand stores a program for causing controller 331 to perform the process of main processor 50. Moreover, in accordance with an instruction from controller 331, this program supplies stored data to controller 331, and stores data supplied from controller 331.

Input device 62 is constituted of a keyboard, a pointing device, and an interface device. Examples of the pointing device include a mouse. The interface device is configured to connect the keyboard, the pointing device and the like to internal bus 330. When the user sets a flight route, information entered via input device 62 in remote controller 40 is supplied to controller 331.

Display 60 is constituted of a CRT (Cathode Ray Tube), a LCD (Liquid Crystal Display), or the like. When the user sets a flight route to main processor 50, a screen for input or the like is presented thereon.

When controller 331 executes the program stored in external memory 333, controller 331 and transceiver 336 function as image capturing data receiver 52, scenario transferer 54, scenario creator 56, and simulator 58 in FIG. 1.

Each of the hardware configurations shown in FIG. 2 and FIG. 3 can be implemented using an ordinary computer system, rather than a dedicated system. For example, on-board controller 10 and remote controller 40 may be implemented by: storing the computer program for performing the above-mentioned operation in a computer readable recording medium (a flexible disk, a CD-ROM, a DVD-ROM or the like); distributing it; and installing the computer program in a computer. Alternatively, on-board controller 10 and remote controller 40 may be implemented by: storing the computer program in a storage device included in a server device on a communication network such as the Internet; and downloading it by an ordinary computer system.

When the function of on-board controller 10 or remote controller 40 is implemented by an OS (operating system) and an application program in an allotted manner or is implemented by cooperation between the OS and the application program, only the application program portion may be stored in the recording medium or the storage device.

Flight control of image capturing system 1 having such a configuration is described below.

Figure 4:
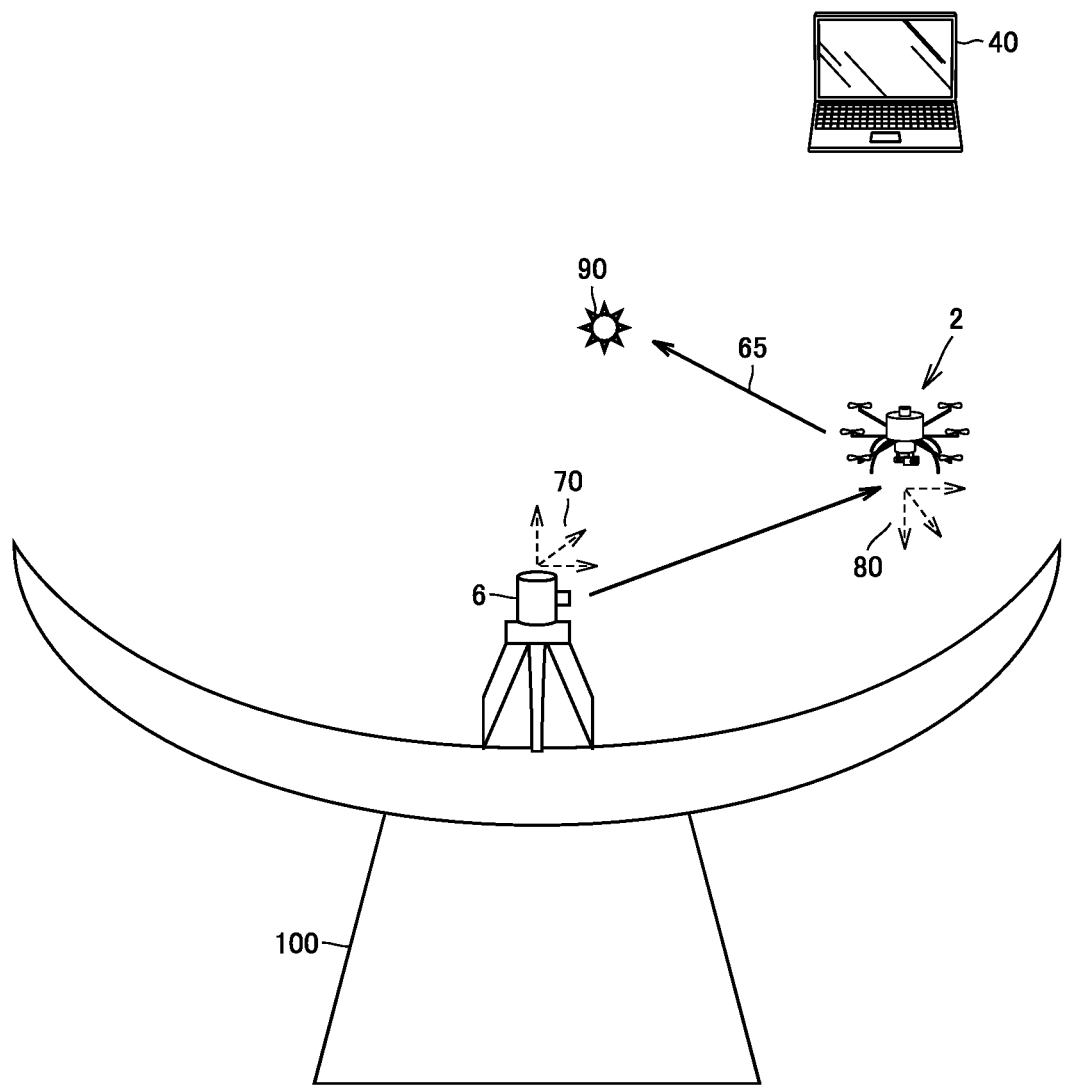
FIG. 4 is a conceptual diagram representing a usage scene of the image capturing system for shape measurement according to the first embodiment.

FIG. 4 is a conceptual diagram representing a usage scene of the image capturing system for shape measurement according to the first embodiment. In FIG. 4, a structure 100 is a target to be measured. Laser tracker 6 is provided at the center of structure 100. A reference coordinate system 70 is set for laser tracker 6, and an air vehicle coordinate system 80 is set for air vehicle 2. On-board controller 10 of air vehicle 2 uses laser tracker 6 to measure the position of air vehicle 2 in real time.

Image capturing system 1 further includes active target 30 mounted on air vehicle 2. Laser tracker 6 applies laser light to active target 30, calculates the position of air vehicle 2 by receiving the laser light reflected from active target 30, and transmits the position of the air vehicle to flight position corrector 15. Laser tracker 6 measures an elevation angle, a rotation angle and a distance based on the reflected light, and transforms them to rectangular coordinates indicating the position of air vehicle 2 on laser tracker 6 (or software). Since the transformation to a rectangular coordinate system is possible on laser tracker 6, the measured position of air vehicle 2 can be directly used for position control of air vehicle 2. Moreover, a measurement can be performed again by moving laser tracker 6, while the same coordinate system is maintained.

By using the laser light from laser tracker 6, stable control can be performed even in the case of a long distance between laser tracker 6 and air vehicle 2. Moreover, by acquiring position information while applying the laser light repeatedly at short intervals, the position of air vehicle 2 can be obtained in substantially real time.

On-board controller 10 of air vehicle 2 calculates an amount of deviation from a via position 90 of a flight scenario 65 based on reference coordinate systems 70, 80, and corrects a direction, an amount of movement, speed and the like for each image capturing to thereby improve the positional precision. By performing the position detection using laser tracker 6 in this manner, real-time measurement and control can be performed, and the shape measurement using the air vehicle can be performed even in a closed space where position information such as GPS cannot be acquired.

Figure 5:
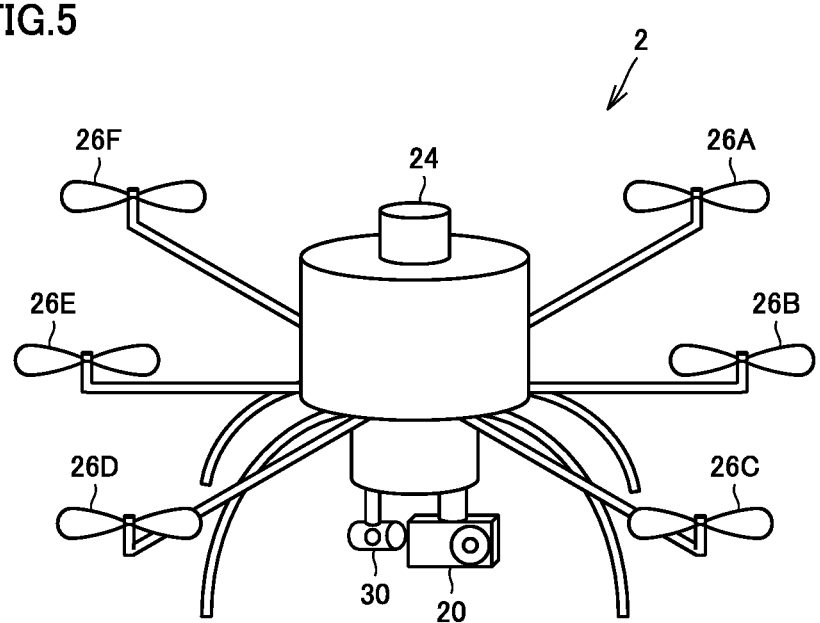
FIG. 5 shows an external appearance of an air vehicle 2.

FIG. 5 shows an external appearance of air vehicle 2. Air vehicle 2 includes: propellers 26A to 26F serving as flight promoter 26 of FIG. 1; obstacle detector 24; image capturing device 20; and active target 30. Examples of image capturing device 20 usable herein include a photogrammetry camera.

Obstacle detector 24 includes one or more of an infrared camera, a proximity sensor, an ultrasonic wave or laser sensor, and a geomagnetic sensor.

Air vehicle 2 having the shape measurement device mounted thereon in FIG. 4 moves through the air around structure 100. Air vehicle 2 moves, in accordance with predetermined flight scenario 65, via one or more via positions 90 indicated in flight scenario 65. As shown in FIG. 5, active target 30 that reflects laser light emitted from laser tracker 6 toward laser tracker 6 is attached to air vehicle 2.

Figure 6:
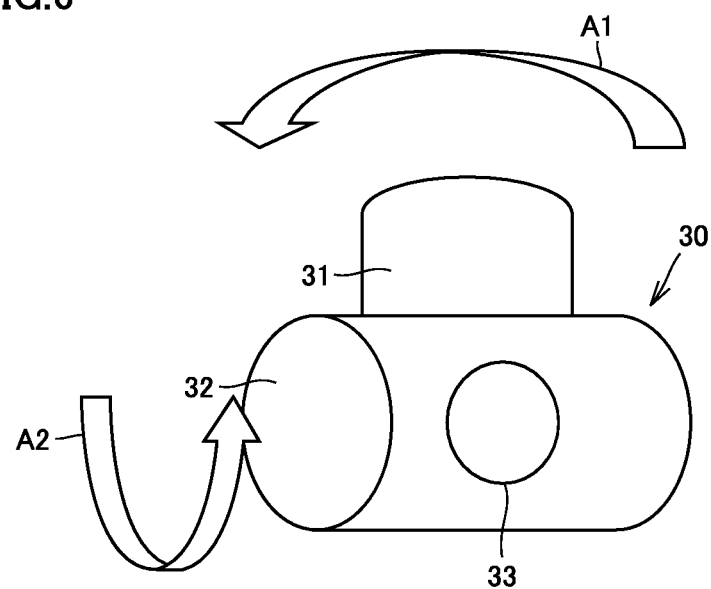
FIG. 6 shows a configuration of an active target.

FIG. 6 shows a configuration of the active target. Active target 30 shown in FIG. 6 includes a first rotation shaft 31, a second rotation shaft 32, and a laser light receiver 33. Active target 30 has two integrated motors for rotating laser light receiver 33 along a first rotation axis (yaw axis rotation direction A1) and a second rotation axis (pitch axis rotation direction A2). When active target 30 captures laser light from laser tracker 6, active target 30 has the function of changing the orientation of laser light receiver 33 by the two motors to thereby automatically track the laser light.

Figure 7:
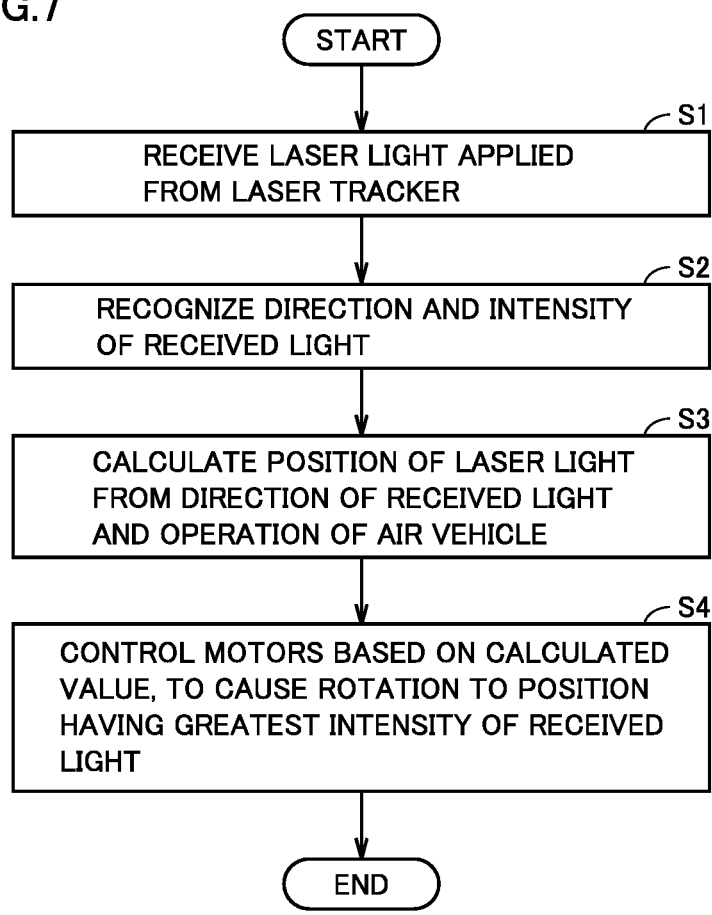
FIG. 7 is a flowchart illustrating operation of the active target.

FIG. 7 is a flowchart illustrating the operation of the active target. Referring to FIG. 7, in step S1, active target 30 receives laser light applied from laser tracker 6. Subsequently, in step S2, active target 30 recognizes direction and intensity of the received laser light. Then, in step S3, active target 30 calculates a position of the laser light from the direction of the received light and the operation of the air vehicle. Then, in step S4, active target 30 controls the two motors based on the calculated value, to rotate first rotation shaft 31 and second rotation shaft 32 to a position having the greatest intensity of the received light.

Unlike active target 30, a prism, a retroreflector or the like simply reflects light from a position measurement device (total station). Thus, it is assumed that a prism or a retroreflector has difficulty in position measurement depending on the flight angle and flight position. In contrast, active target 30 that receives laser light automatically recognizes incident direction and intensity of the received laser light by setting a state in which the laser light was initially received, and moves laser light receiver 33 in the incident direction of the laser light even if air vehicle 2 with attached active target 30 moves. Unlike a prism or the like, active target 30 operates in such a manner as to automatically capture the laser light emitted by laser tracker 6, thus facilitating the measurement.

Turning back to FIG. 4, image capturing system 1 for shape measurement measures the shape of entire structure 100 based on a result of the measurement of the shape of structure 100 at each via position 90. Air vehicle 2 operates without human intervention under control of remote controller 40. Remote controller 40 transmits, to on-board controller 10 by wireless communication or the like, commands, data and the like required to control the flight of air vehicle 2 and to control the measurement by image capturing device 20.

The movement from via position 90 to next via position 90, and the movement for correcting the amount of deviation from the flight scenario are linear movements.

Assuming that the current position of the air vehicle is $(X_i, Y_i, Z_i)$, and the next via position is $(X_{i-1}, Y_{i+1}, Z_{i+1})$, then an amount of movement L and a direction A are indicated by the following equation or the like:

$$L=((X_{i+1}-X_i)^2+(Y_{i+1}-Y_i)^2+(Z_{i+1}-Z_i)^2)^{1/2}$$

$$A=((X_{i+1}-X_i),(Y_{i-1}-Y_i),(Z_{i+1}-Z_i))$$

Figure 8:
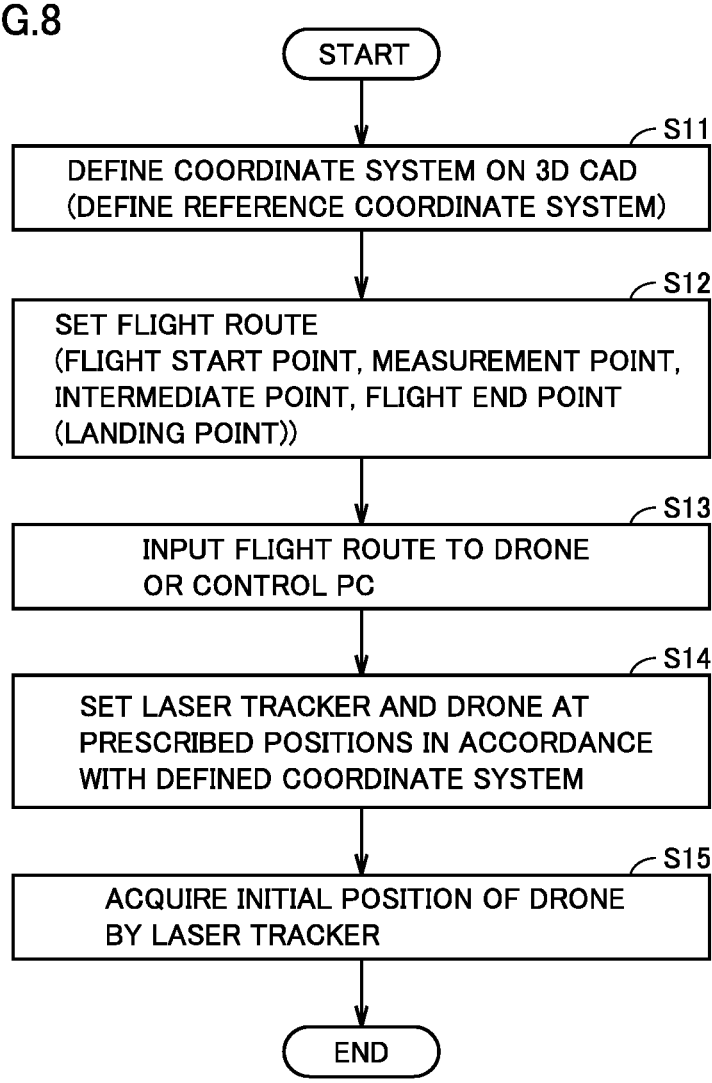
FIG. 8 is a flowchart showing a procedure of preparation for measurement in the first embodiment.

FIG. 8 is a flowchart showing a procedure of preparation for the measurement in the first embodiment. In step S11, the operator sets, for a flight scenario, reference coordinate system 70 using a 3D model such as three-dimensional CAD data. Subsequently, in step S12, the operator sets a flight route by setting a flight start point, a landing point (flight end point), via position (measurement point) 90 and the like for the flight scenario. The flight scenario thus set serves as coordinate data based on reference coordinate system 70 set on laser tracker 6.

Subsequently, in step S13, the operator inputs the flight route to air vehicle 2 (drone) or remote controller 40 (control PC). In step S14, the operator installs laser tracker 6 at the position that has been set on the 3D model, and sets air vehicle 2 at the flight start point. Lastly, in step S15, the operator checks the position of air vehicle 2 by laser tracker 6 so as to cause active target 30 to receive, recognize and capture the laser light. The checking may be performed in a stopped state, or may be performed in a hovering state during flight. The preparation for the automatic measurement is thus completed.

By creating in advance the flight scenario based on the 3D model in this manner, flight risks can be extracted.

Figure 9:
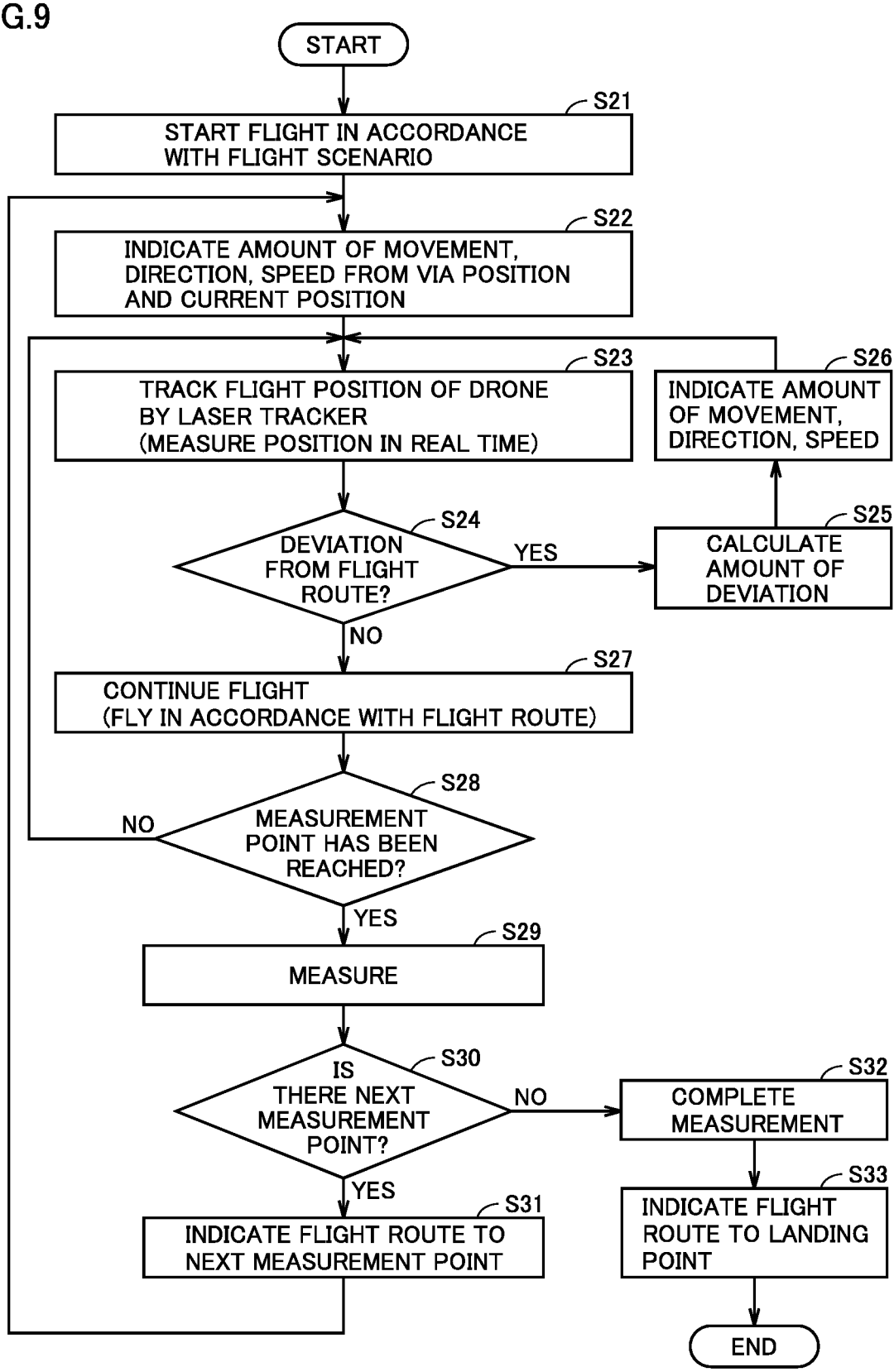
FIG. 9 is a flowchart illustrating a process of automatic measurement of the shape of a structure in the first embodiment.

FIG. 9 is a flowchart illustrating a process of the automatic measurement of the shape of a structure in the first embodiment. In response to an instruction to start flight from the operator, in step S21, on-board controller 10 indicates first via position 90 in accordance with the flight scenario, and air vehicle 2 start to fly. In step S22, on-board controller 10 calculates an amount of movement, direction and speed from the via position and the current position, and provides an instruction to flight promoter 26.

In step S23, laser tracker 6 tracks the position of air vehicle 2, and on-board controller 10 receives position data via communicator 22. In step S24, flight position corrector 15 of on-board controller 10 determines whether or not the position of air vehicle 2 has deviated from the flight route of the flight scenario.

When the position of air vehicle 2 has deviated from the flight route (YES in S24), on-board controller 10 calculates an amount of deviation from the flight scenario in step S25, and instructs flight promoter 26 to correct the flight position by indicating the amount of movement, direction, speed and the like in step S26.

With regard to the amount of movement, direction and speed, on-board controller 10 calculates the direction and speed so as to bring the deviation from the flight scenario closer to zero, and provides an instruction within a feasible speed range.

The amount of movement and direction are calculated as vector quantities using information on coordinates of the current position $(X_i, Y_i, Z_i)$ and the via position $(X_{i-1}, Y_{i-1}, Z_{i+1})$, and then indicated.

In this manner, the flight control is performed while the position is being measured in real time based on the flight scenario, and the amount of deviation from the set flight scenario is being calculated. Accordingly, the need for coordinate transformation and the like is eliminated, so that the amount of calculation for the coordinate transformation can be reduced.

When there is no deviation (NO in S24), on the other hand, the flight is continued without change in step S27.

Subsequently, in step S28, on-board controller 10 checks whether or not via position 90 which is a measurement point has been reached. When via position 90 has not been reached (NO in S28), the process of step S23 and the subsequent steps is repeated again to continue the flight without change. When via position 90 has been reached (YES in S28), on the other hand, a measurement is performed at that location in step S29 The measurement may be performed in a hovering state, or may be performed while moving to the next via position.

After the measurement at via position 90, in step S30, on-board controller 10 checks whether or not there is a next via position in the flight scenario. When there is a next via position (YES in S30), on-board controller 10 provides information on the amount of movement, direction and speed for movement to the next via position (S31, S22). When there is no next via position (NO in S30), on-board controller 10 completes the measurement (S32), and indicates a flight route to a landing point (S33). Specifically, on-board controller 10 provides information on the amount of movement, direction and speed as with the movement between the via positions. The measurement ends once the landing is completed.

When moving to via position 90 indicated in the flight scenario and performing the measurement, feasible speed is considered in addition to calculating the amount of movement and direction. Accordingly, the time it takes to perform the measurement can be calculated in advance, so that the flight can be performed in consideration of battery capacity.

With regard to the speed, constant-speed flight is basically employed. However, the speed may be minutely corrected in step S26 during the flight. The speed can be set in consideration of a total flight time and measurement time.

The flight time of air vehicle 2 is constrained by the capacity of battery 28. A time required for air vehicle 2 to complete the measurement needs to be such that the battery has a sufficient remaining amount (remaining amount enough to allow for safe landing). In consideration of the battery capacity, the flight needs to be completed to satisfy the following condition:

Battery capacity(maximum flight time)>Battery remaining amount during flight, and flight time that enables safe landing≥Flight and measurement time during flight Thus, in the flight scenario, a speed between flight points needs to be determined from the total flight time. A constant speed is basically employed. However, when a deviation occurs from the flight scenario (flight route), a speed faster than an initially provided speed needs to be indicated to bring the amount of deviation (amount of delay) of flight speed to zero to compensate for the delay.

It is assumed, for example, that the total flight time is 45 minutes, the total flight distance is 36 m, and there are 9 flight points, and that hovering is to be performed for one minute at each point. A movement speed between the points is 1 m/min. That is, subtracting the hovering time of 9 minutes from the total flight time of 45 minutes gives 36 minutes to be used for the movement. Dividing the flight distance of 36 m by this 36 minutes gives 1 m/min.

When a substantial deviation from the flight route occurs due to wind during movement from a point A to a point B, such as when a moved distance increases to 9 m from the original 6 m due to a positional deviation, then a speed of 1.5 m/min needs to be indicated to compensate for the delay and bring the amount of deviation to zero (the original indicated speed is 1 m/min; since the distance has been increased by 1.5 times, the movement speed increased by 1.5 times is also indicated again).

If the movement is completed between two coordinates in a single coordinate system without a change in altitude, the amount of movement can be determined from two-dimensional information. Employing an instruction of a two-dimensional amount of movement facilitates the calculation and the control.

Figure 10:
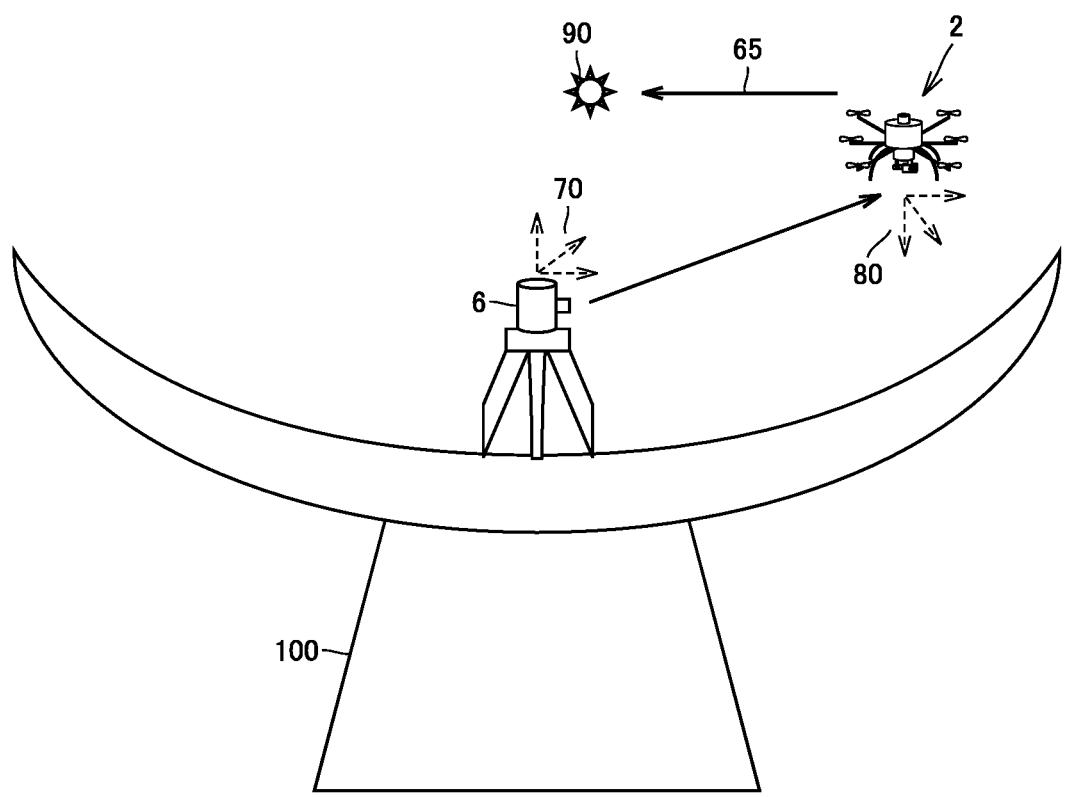
FIG. 10 is a conceptual diagram representing a usage scene of the image capturing system when the air vehicle is moved two-dimensionally.

FIG. 10 is a conceptual diagram representing a usage scene of the image capturing system when the air vehicle is moved two-dimensionally. In FIG. 10, structure 100 and laser tracker 6 are the same as those in FIG. 4. The conceptual diagram of FIG. 10 is different from FIG. 4 in that it is based on the premise that a flight altitude of air vehicle 2 is controlled to be the same as the altitude of via position 90.

Assuming that the current position of the air vehicle is $(X_i, Y_i, Z_i)$, the next via position is $(X_{i+1}, Y_{i+1}, Z_{i+1})$, and they are at the same altitude, then $Z_{i+1}-Z_i=0$ is satisfied. Thus, amount of movement L is indicated by the following equation. Direction A is a two-dimensional vector.

$$L=((X_{i+1}-X_i)^2+(Y_{i+1}-Y_i)^2)^{1/2}$$

$$A=((X_{i+1}-X_i),(Y_{i-1}-Y_i))$$

In FIG. 10, when air vehicle 2 is to fly in a plane of the same altitude (Z axis, for example) from the beginning, then a laser range finder may be attached to air vehicle 2 only for position control in an altitude direction, for example, to control air vehicle 2 so as to achieve a constant altitude. In this case, on-board controller 10 only has to sequentially calculate and indicate an amount of movement in the plane (X, Y). The amount of calculation for calculating the amount of movement from the coordinates obtained from laser tracker 6 can be reduced, thereby reducing a calculation load on on-board controller 10.

Second Embodiment

In the first embodiment, one laser tracker 6 and one air vehicle 2 are used. In a second embodiment, a plurality of laser trackers 6 and a plurality of air vehicles 2 are used and managed in accordance with different flight scenarios. As a result, the entire structure can be readily measured.

Figure 11:
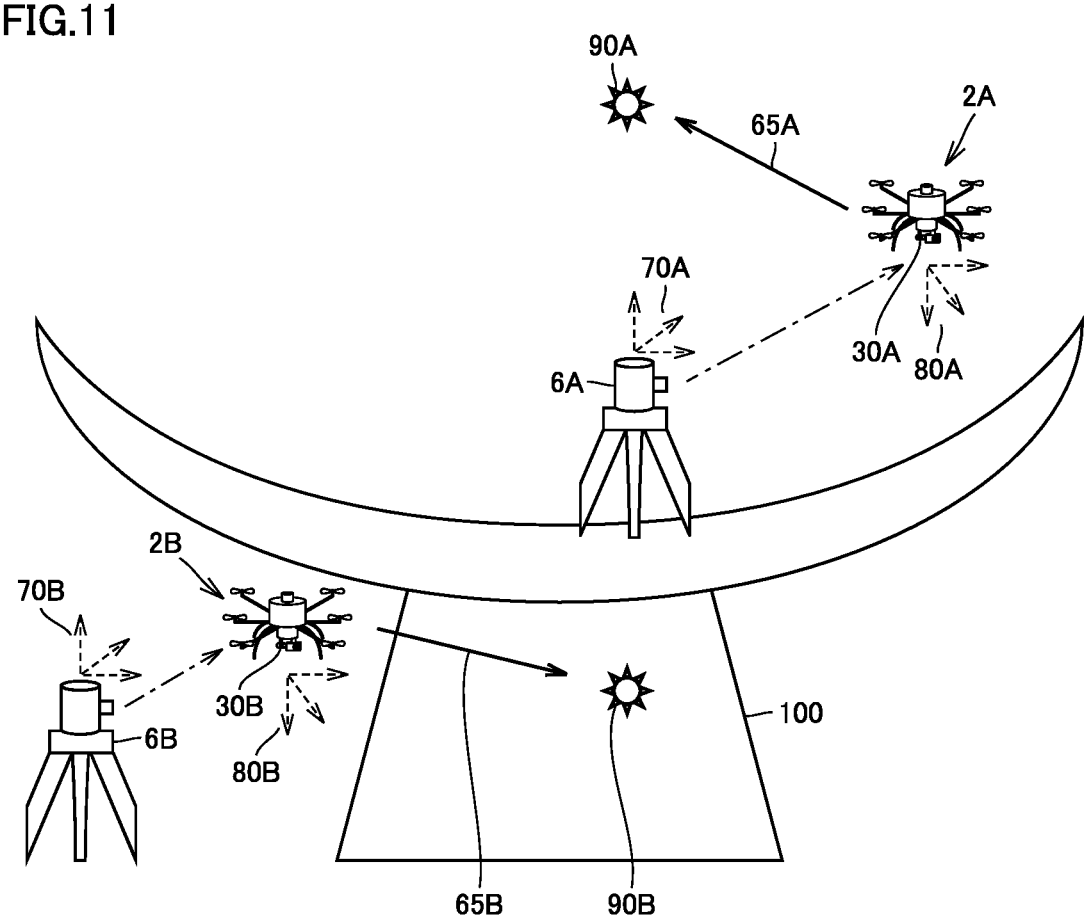
FIG. 11 is a conceptual diagram representing a usage scene of an image capturing system for shape measurement according to a second embodiment.

FIG. 11 is a conceptual diagram representing a usage scene of an image capturing system for shape measurement according to the second embodiment. As shown in FIG. 11, a plurality of laser trackers 6A, 6B are prepared, and a plurality of air vehicles 2A, 2B are prepared. It should be noted that air vehicles 2A, 2B may have a similar configuration to that of air vehicle 2 shown in FIGS. 1 to 6. A different flight scenario is created based on a 3D model for each of air vehicles 2A, 2B. The two flight scenarios are created such that some (10 to 50%, for example) of their measurement locations overlap each other. The same 3D model may be used for the creation, or different models (models of only parts of the measurement locations) may be used. The shape measurement can be efficiently performed by creating the different flight scenarios. When different 3D models are used to create the flight scenarios, the efficiency of the process of creating the flight scenarios can also be improved.

After the flight scenarios have been created, air vehicles 2A, 2B are installed at their initial flight positions to start flight as in the first embodiment. At the beginning of the flight, laser trackers 6A, 6B perform initial checking of whether active targets 30A, 30B mounted on air vehicles 2A, 2B can capture laser light. Subsequently, flight and measurement are performed based on the flight scenarios. By superimposing and combining pieces of data of the overlapping portions after the measurement has been completed, the measurement can be performed as a single structure even from different measurements.

The image capturing system of the second embodiment can obtain similar effects to those of the image capturing system of the first embodiment, and furthermore, can complete the measurement in a short period of time when the structure is large-sized.

Third Embodiment

In the second embodiment, a plurality of laser trackers and a plurality of air vehicles are used. In a third embodiment, a plurality of laser trackers and one air vehicle are prepared and managed. As a result, a shape which is difficult to track with laser light from one laser tracker can be measured in a short period of time.

Figure 12:
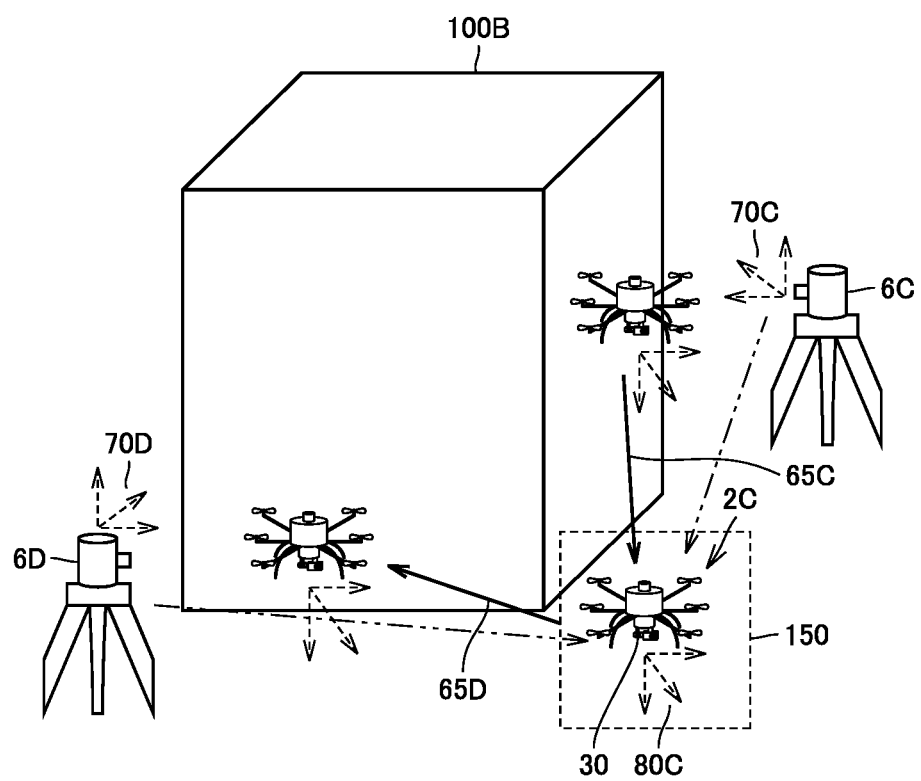
FIG. 12 is a conceptual diagram representing a usage scene of an image capturing system for shape measurement according to a third embodiment.

FIG. 12 is a conceptual diagram representing a usage scene of an image capturing system for shape measurement according to the third embodiment. An air vehicle 2C flies from a flight start point based on a flight scenario 65C, while correcting its flight position based on tracking by a laser tracker 6C. Then, air vehicle 2C hovers at a switching position 150 where the laser tracker is switched, and switches the tracking by laser tracker 6C to tracking by a laser tracker 6D. Air vehicle 2C also switches the coordinate system from a coordinate system 70C to a coordinate system 70D, and continues the flight based on a flight scenario 65D, while correcting its flight position based on tracking by laser tracker 6D.

The flight scenarios are created in advance such that the coordinate system is switched at switching position 150. Switching position 150 is set to a position where the laser light can be received from laser tracker 6C and laser tracker 6D without being blocked by a structure 100B.

Specifically, a positional relation between laser tracker 6C and laser tracker 6D is obtained in advance at a stage of creating the flight scenarios. Initial flight scenario 65C is created based on laser tracker 6C, then a coordinate transformation is carried out to a coordinate system based on laser tracker 6D at switching position 150. Flight scenarios 65C, 65D each include operation of hovering at switching position 150, and switching the laser light captured by active target 30 of air vehicle 2C. It should be noted that air vehicle 2C may have a similar configuration to that of air vehicle 2 shown in FIGS. 1 to 6.

Figure 13:
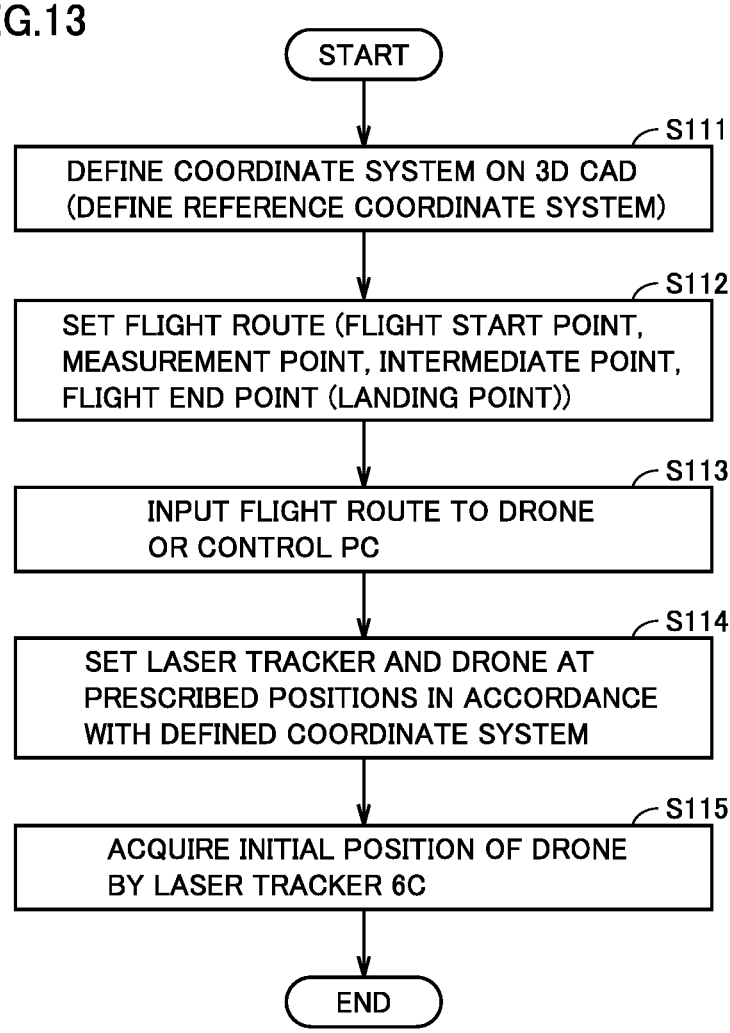
FIG. 13 is a flowchart showing a procedure of preparation for measurement in the third embodiment.

FIG. 13 is a flowchart showing a procedure of preparation for the measurement in the third embodiment. In step S111, the operator sets reference coordinate system 70C for flight scenario 65C. Moreover, in step S111, the operator sets reference coordinate system 70D for flight scenario 65D.

Subsequently, in step S112, the operator sets a flight route by setting a flight start point, a flight end point (switching position 150), a via position (measurement point) and the like for flight scenario 65C. Flight scenario 65C thus set serves as coordinate data based on reference coordinate system 70C set on laser tracker 6C.

Moreover, the operator sets a flight route by setting a flight start point (switching position 150), a landing point (flight end point), a via position (measurement point) and the like for flight scenario 65D. Flight scenario 65D thus set serves as coordinate data based on reference coordinate system 70D set on laser tracker 6D.

Subsequently, in step S113, the operator inputs the flight route to air vehicle 2C (drone) or remote controller 40 (control PC). In step S114, the operator installs laser tracker 6 at the position that has been set on the 3D model, and sets air vehicle 2C at the flight start point. Lastly, in step S115, the operator checks the position of air vehicle 2C by laser tracker 6C so as to cause active target 30 to receive, recognize and capture the laser light from laser tracker 6C. The checking may be performed in a stopped state, or may be performed in a hovering state during flight. The preparation for the automatic measurement is thus completed.

Figure 14:
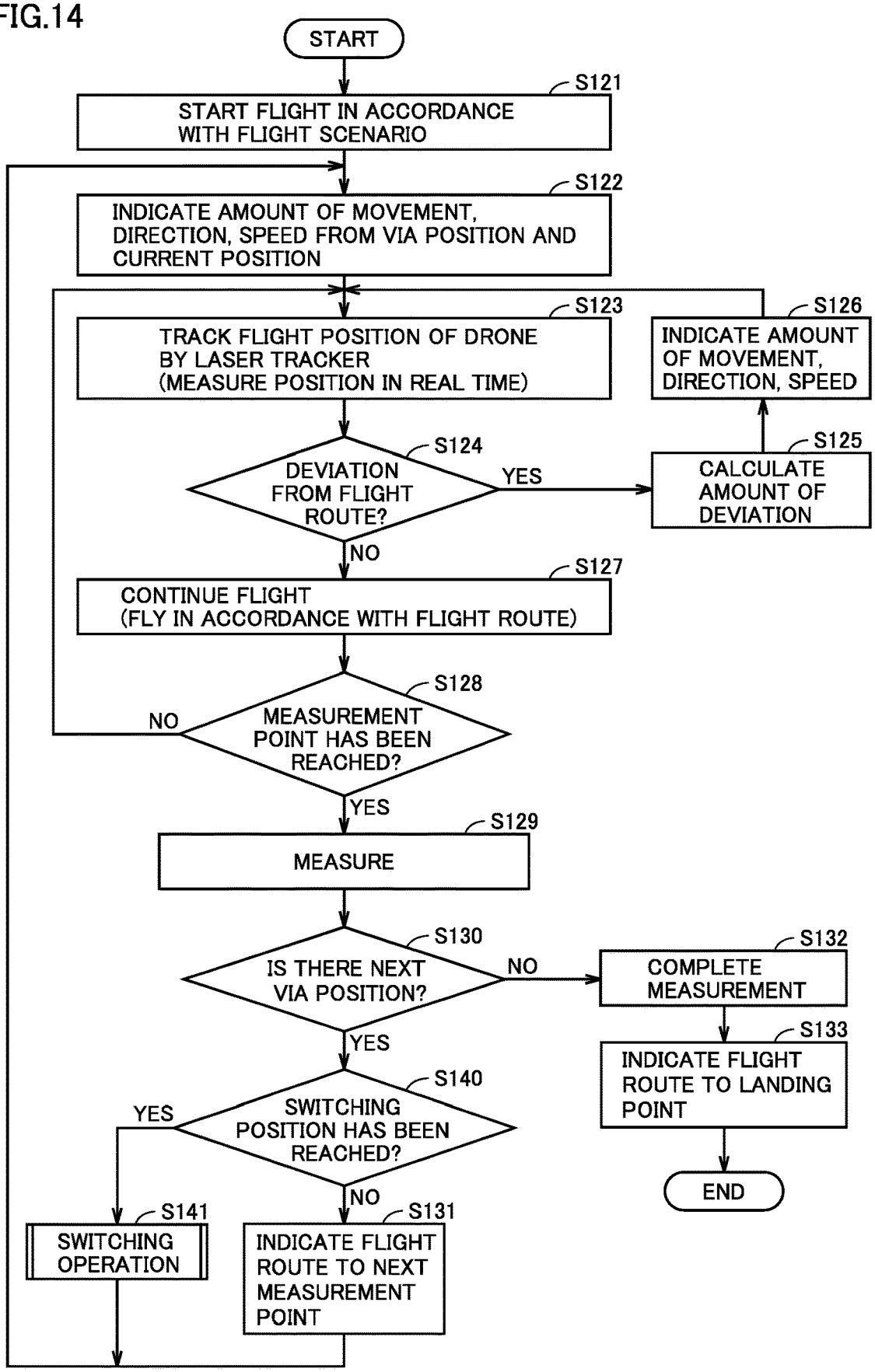
FIG. 14 is a flowchart illustrating a process of automatic measurement of the shape of a structure in the third embodiment.

FIG. 14 is a flowchart illustrating a process of the automatic measurement of the shape of a structure in the third embodiment. In response to an instruction to start flight from the operator, in step S121, on-board controller 10 indicates the first via position in accordance with flight scenario 65C, and air vehicle 2C start to fly. In step S122, on-board controller 10 calculates an amount of movement, direction and speed from the via position and the current position, and provides an instruction to flight promoter 26.

In step S123, laser tracker 6C tracks the position of air vehicle 2C, and on-board controller 10 receives position data via communicator 22. In step S124, flight position corrector 15 of on-board controller 10 determines whether or not the position of air vehicle 2C has deviated from the flight route of flight scenario 65C.

When the position of air vehicle 2C has deviated from the flight route (YES in S124), on-board controller 10 calculates an amount of deviation from the flight scenario in step S125, and instructs flight promoter 26 to correct the flight position by indicating the amount of movement, direction, speed and the like in step S126.

With regard to the amount of movement, direction and speed, on-board controller 10 calculates the direction and speed so as to bring the deviation from the flight scenario closer to zero, and provides an instruction within a feasible speed range.

When there is no deviation (NO in S124), on the other hand, the flight is continued without change in step S127.

Subsequently, in step S128, on-board controller 10 checks whether or not the via position which is a measurement point has been reached. When the via position has not been reached (NO in S128), the process of step S123 and the subsequent steps is repeated again to continue the flight without change. When the via position has been reached (YES in S128), on the other hand, a measurement is performed at that location in step S129. The measurement may be performed in a hovering state, or may be performed while moving to the next via position.

After the measurement at the via position, in step S130, on-board controller 10 checks whether or not there is a next via position in the flight scenario. When there is a next via position (YES in S130), on-board controller 10 determines whether or not the next via position is the switching position, and determines whether or not switching position 150 has been reached. When the next via position is not the switching position (NO in S140), on-board controller 10 provides information on the amount of movement, direction and speed for movement to the next via position (S131, S122). When there is no next via position (NO in S130), on-board controller 10 completes the measurement (S132), and indicates a flight route to a landing point (S133). Specifically, on-board controller 10 provides information on the amount of movement, direction and speed, as with the movement between the via positions. The measurement ends once the landing is completed.

When the next via position is the switching position and the switching position has been reached in S140 (YES in S140), switching operation is performed in step S141.

Figure 15:
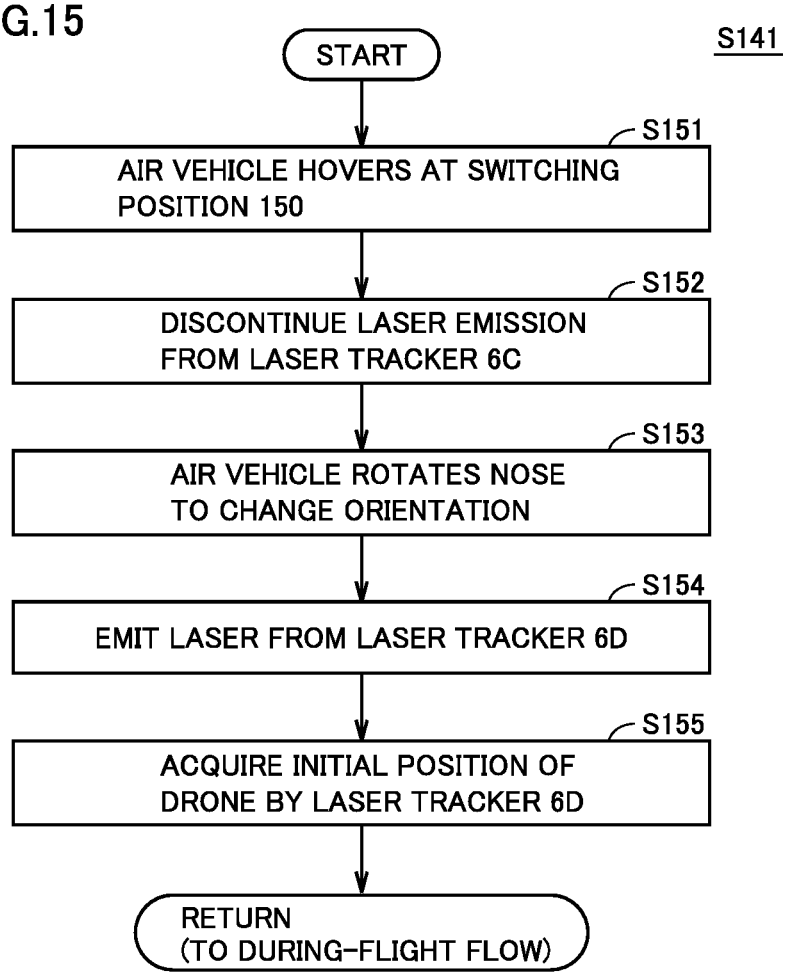
FIG. 15 is a flowchart illustrating a process of switching operation in FIG. 14.

FIG. 15 is a flowchart illustrating a process of the switching operation in FIG. 14. An instruction to switch the tracking is provided when the operator confirms that air vehicle 2C has reached switching position 150 of FIG. 12, to switch the tracking laser tracker from laser tracker 6C to laser tracker 6D. Specifically, the flight scenario is created such that air vehicle 2C hovers at switching position 150 in step S151. Then, the application of laser light from laser tracker 6C is discontinued (S152), and then air vehicle 2C rotates its nose in a hovering state to change its orientation so as to receive laser light from laser tracker 6D (S153).

Laser light is applied from laser tracker 6D toward the active target (S154). Lastly, in step S155, the operator checks the position of air vehicle 2C by laser tracker 6D so as to cause active target 30 to receive, recognize and capture the laser light from laser tracker 6D. The checking may be performed in a hovering state during flight, or may be performed after air vehicle 2C has been temporarily landed.

Subsequently, the process returns again to step S122 of FIG. 14, and the process of step S122 and the subsequent steps is repeated again with switching position 150 as the origin after the switching.

It should be noted that, when the positional relation between laser tracker 6C and laser tracker 6D is clear, the flight control can be performed by performing a transformation to coordinate system 70D using coordinate system 70C as reference coordinates (shifting the origin of coordinate system 70D by the amount of movement of the laser tracker), without switching the coordinates.

The shape measurement data is combined by extracting characteristic points of the data on shape measurement software, and matching the characteristic points with one another. The shape measurement data is combined by remote controller 40 or a separately prepared shape measurement data combination device (general personal computer).

According to the image capturing system of the present embodiment described above, the following effects (1) to (4) are obtained:

(1) Since the X, Y and Z coordinates are calculated from the measured values with the laser tracker as the origin, the need for coordinate transformation for controlling air vehicle 2 is eliminated. The coordinates of air vehicle 2 can be defined in terms of three-dimensional rectangular coordinates, rather than a polar coordinate system generally used for a measurement instrument such as a total station.

(2) Since the active target is used, continuous position data can be acquired.

(3) The use of laser light ensures real-time performance, and allows for stable control even in the case of a long distance.

(4) Since the position detection and the coordinate calculation of the air vehicle are entrusted to the laser tracker, the process of the on-board controller of the air vehicle is reduced.

Although the embodiments of the present invention have been described, it should be understood that the embodiments disclosed herein are illustrative and non-restrictive in every respect. The scope of the present invention is defined by the terms of the claims, and is intended to include any modifications within the meaning and scope equivalent to the terms of the claims. The embodiments of the present invention can be freely combined, modified, or omitted within the spirit of the present invention.

What is claimed is:

1. An image capturing system for shape measurement of a structure, the image capturing system comprising:
    an air vehicle configured to fly and hover;
    a ground measurement instrument configured to measure a position of the air vehicle;
    an image capturing device mounted on the air vehicle and configured to capture an image of the structure;
    an on-board controller mounted on the air vehicle; and
    a remote controller,
    the remote controller including processing circuitry configured to
        create a flight scenario including an image capturing point and an image capturing condition when capturing the image, and
        transfer the created flight scenario to the on-board controller,
    the on-board controller including processing circuitry configured to
        store the flight scenario,
        control the image capturing device, and
        control the air vehicle based on the flight scenario,
    the on-board controller being configured to correct the position of the air vehicle based on a result of measurement by the ground measurement instrument, an amount of deviation in the position of the air vehicle from a position indicated by the flight scenario,
    wherein
    the air vehicle has an active target mounted thereon that includes at least one motor and a laser light receiver, and
    the ground measurement instrument is configured to apply laser light to the active target, calculate the position of the air vehicle by receiving the laser light reflected from the active target, and transmit the position of the air vehicle to the on-board controller,
    the active target being configured to detect a direction and intensity of the laser light received from the ground measurement instrument, calculate a position of the laser light based on the detected direction, and control the at least one motor to rotate the active target to a position having a greatest intensity of received laser light.

2. The image capturing system for shape measurement of a structure according to claim 1, wherein
    the on-board controller is configured to, after the flight controller has moved the air vehicle to the image capturing point, calculate an amount of deviation between coordinates of the image capturing point and coordinates of the position of the air vehicle, and make a correction.

3. The image capturing system for shape measurement of a structure according to claim 1, wherein
    the remote controller is configured to create the flight scenario from a three-dimensional computer-aided design (CAD) model.

4. The image capturing system for shape measurement of a structure according to claim 1, wherein
    the remote controller is configured to create the flight scenario including the image capturing point based on shape information of the structure.

5. An air vehicle having mounted thereon an image capturing device configured to capture an image of a structure, and being configured to fly and hover, the air vehicle comprising:
    an on-board controller that includes processing circuitry configured to
    store a flight scenario including an image capturing point and an image capturing condition when capturing the image;
    control the image capturing device; and
    control the air vehicle based on the flight scenario,
    the on-board controller being configured to correct a position of the air vehicle based on an amount of deviation in the position of the air vehicle from the flight scenario, the amount of deviation being calculated based on a result of measurement by a ground measurement instrument configured to measure the position of the air vehicle,
    wherein
    the air vehicle further includes an active target mounted thereon that includes at least one motor and a laser light receiver, and
    the ground measurement instrument is configured to apply laser light to the active target, calculate the position of the air vehicle by receiving the laser light reflected from the active target, and transmit the position of the air vehicle to the on-board controller,
    the active target being configured to detect a direction and intensity of the laser light received from the ground measurement instrument, calculate a position of the laser light based on the detected direction, and control the at least one motor to rotate the active target to a position having a greatest intensity of received laser light.

6. A method implemented by an image capturing system for shape measurement of a structure, the image capturing system including an air vehicle configured to fly and hover, a ground measurement instrument configured to measure a position of the air vehicle, an image capturing device mounted on the air vehicle and configured to capture an image of the structure, an on-board controller mounted on the air vehicle, and a remote controller, the method comprising:
    creating, by the remote controller, a flight scenario including an image capturing point and an image capturing condition when capturing the image, and
    transferring, by the remote controller, the created flight scenario to the on-board controller,
    storing, by the on-board controller, the flight scenario,
    controlling, by the on-board controller, the air vehicle based on the flight scenario, the on-board controller correcting the position of the air vehicle based on a result of measurement by the ground measurement instrument, an amount of deviation in the position of the air vehicle from a position indicated by the flight scenario,
wherein
the air vehicle has an active target mounted thereon that includes at least one motor and a laser light receiver, and
the ground measurement instrument performs applying laser light to the active target, calculating the position of the air vehicle by receiving the laser light reflected from the active target, and transmitting the position of the air vehicle to the on-board controller,
the active target detecting a direction and intensity of the laser light received from the ground measurement instrument, calculating a position of the laser light based on the detected direction, and controlling the at least one motor to rotate the active target to a position having a greatest intensity of received laser light.

7. The image capturing system for shape measurement of a structure according to claim 1, wherein the ground measurement instrument is a first ground measurement instrument that is configured to measure a position of the air vehicle at a first location relative to the structure, and the image capturing system further includes at least a second ground measurement instrument configured to measure a position of the air vehicle at a second location relative to the structure that is different than the first location, and the on-board controller is configured to control the air vehicle based on the flight scenario to hover at a switching position to switch being tracked by the first ground measurement instrument to being tracked by the second ground measurement instrument.

* * * * *